US006867629B2

(12) United States Patent
Drost et al.

(10) Patent No.: US 6,867,629 B2
(45) Date of Patent: Mar. 15, 2005

(54) INTEGRATED CIRCUIT AND METHOD OF ADJUSTING CAPACITANCE OF A NODE OF AN INTEGRATED CIRCUIT

(75) Inventors: Robert J. Drost, Mountain View, CA (US); Robert J. Bosnyak, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/247,401

(22) Filed: Sep. 19, 2002

(65) Prior Publication Data

US 2003/0048124 A1 Mar. 13, 2003

Related U.S. Application Data

(63) Continuation of application No. 09/942,354, filed on Aug. 29, 2001, now abandoned.

(51) Int. Cl.$^7$ .............................................. H03H 11/26
(52) U.S. Cl. ........................................ 327/270; 327/264
(58) Field of Search ................................. 327/261, 263, 327/264, 270, 283

(56) References Cited

U.S. PATENT DOCUMENTS

| | | | | | |
|---|---|---|---|---|---|
| 4,103,187 | A | * | 7/1978 | Imamura | 327/437 |
| 5,416,436 | A | * | 5/1995 | Rainard | 327/270 |
| 5,459,424 | A | | 10/1995 | Hattori | 327/278 |
| 5,714,907 | A | | 2/1998 | Bazes | |
| 5,825,217 | A | * | 10/1998 | Lehavot | 327/111 |
| 5,900,766 | A | | 5/1999 | Naffziger et al. | 327/382 |
| 6,054,908 | A | * | 4/2000 | Jackson | 333/174 |
| 6,121,813 | A | | 9/2000 | Furuchi | 327/285 |
| 6,150,862 | A | | 11/2000 | Vikinski | 327/262 |
| 6,154,078 | A | | 11/2000 | Stave | |

FOREIGN PATENT DOCUMENTS

| JP | 10107598 | | 4/1998 |
|---|---|---|---|
| JP | 11074463 A | * | 3/1999 |

OTHER PUBLICATIONS

Dally, William J. and Poulton, John W., Digital Systems Engineering, The Press Syndicate of the University of Cambridge, 1993, p. 590–591.

* cited by examiner

Primary Examiner—Dinh T. Le
(74) Attorney, Agent, or Firm—Zagorin O'Brien Graham LLP

(57) ABSTRACT

The present invention relates to an integrated circuit device and method of adjusting capacitance of a node of an integrated circuit In one embodiment, the device comprises a first digital input, a first parasitic capacitance block, a first output, a second digital input, a second parasitic capacitance block and a second output. The first parasitic capacitance block includes an inverter, a variable capacitance element, and a wire capacitance element. The first parasitic capacitance block has a capacitance that is a function of the first digital input. The first output is responsive to the first parasitic capacitance block, and the second output is responsive to the second parasitic capacitance block. In a particular embodiment, the method includes selecting a logic state of a digital input; applying the digital input to a parasitic capacitance block having an output, the output having a first capacitance when the digital input is in first logic state and a second capacitance when the digital input is in a second logic state; and adjusting a capacitance with respect to a second circuit node within the integrated circuit by applying the output to the second circuit node.

21 Claims, 6 Drawing Sheets

US 6,867,629 B2

INTEGRATED CIRCUIT AND METHOD OF ADJUSTING CAPACITANCE OF A NODE OF AN INTEGRATED CIRCUIT

CROSS-REFERENCE TO RELATED APPLICATION

This application is a continuation of application Ser. No. 09/942,354, filed Aug. 29, 2001, now abandoned, the entirety of which is incorporated herein by reference.

BACKGROUND

1. Field of the Invention

The present invention relates generally to integrated circuits and more particularly to methods of digitally adjusting capacitance of a node of an integrated circuit.

2. Description of the Related Art

Many integrated circuits are being developed to carry and process very high frequency signals. To handle external signal noise, it is often desirable to match capacitance for a given circuit node. A conventional approach to adjust capacitance is to combine a transistor connected to a series of fixed capacitors to the node. When the transistor is activated, the fixed capacitors are added, thereby adjusting the effective capacitance of the node. An example of this type of system is described in "Digital Systems Engineering", by Dally and Poulton, pages 590–591, (1998). But, at very high frequencies, the fixed capacitor elements become ineffective in providing capacitance because the RC time constant of the transistor impedance and the fixed capacitor elements is too large compared to the very high frequency signal. Further, it would be desirable if the adjustable capacitance could be selected digitally to provide convenient control.

Accordingly, there is a need for an improved integrated circuit and method of digitally selecting an adjustable capacitance of a node of an integrated circuit, especially with respect to high frequency signals.

SUMMARY

The present invention relates to an integrated circuit device and method of adjusting capacitance of a node of an integrated circuit. In one embodiment, the device comprises a first digital input, a first parasitic capacitance block, a first output, a second digital input, a second parasitic capacitance block, and a second output. The first parasitic capacitance block includes an inverter, a variable capacitance element, and a wire capacitance element. The first parasitic capacitance block has a capacitance that is a function of the first digital input. The first output is responsive to the first parasitic capacitance block, and the second output is responsive to the second parasitic capacitance block.

In another embodiment, the integrated circuit comprises a digital inverter, a circuit node responsive to the digital inverter, a first transistor having a first terminal coupled to the circuit node and a second terminal coupled to a voltage source, a second transistor having a first terminal coupled to the circuit node and a second terminal coupled to ground, a capacitor element responsive to the circuit node, and an output coupled to the capacitor element.

In another embodiment, the integrated circuit comprises a digital inverter, an intermediate circuit node responsive to the digital inverter, a transistor having a first terminal coupled to the intermediate node and a second terminal coupled to ground, a capacitor element responsive to the intermediate node, and an output coupled to the capacitor element.

In a further embodiment, the integrated circuit comprises a digital inverter, an intermediate circuit node responsive to an output terminal of the digital inverter, a transistor having a first terminal coupled to the intermediate node and a second terminal coupled to a voltage source, a capacitor element responsive to the intermediate node, and an output coupled to the capacitor element.

In a further embodiment, the integrated circuit comprises a digital input, a parasitic capacitance block containing a first intermediate node, and circuit logic. The circuit logic contains a second intermediate node. The parasitic capacitance block provides an output having a selectable capacitance, the output having a first capacitance when the digital input is in a first logic state and a second capacitance when the digital input is in a second logic state.

In a particular embodiment, the method includes selecting a logic state of a digital input; applying the digital input to a parasitic capacitance block having an output, the output having a first capacitance when the digital input is in a first logic state and a second capacitance when the digital input is in a second logic state; and adjusting a capacitance with respect to a second circuit node within the integrated circuit by applying the output to the second circuit node.

BRIEF DESCRIPTION OF THE DRAWINGS

The use of the same reference symbols in different drawings indicates similar or identical items.

DESCRIPTION OF THE DRAWING(S)

Figure 1:
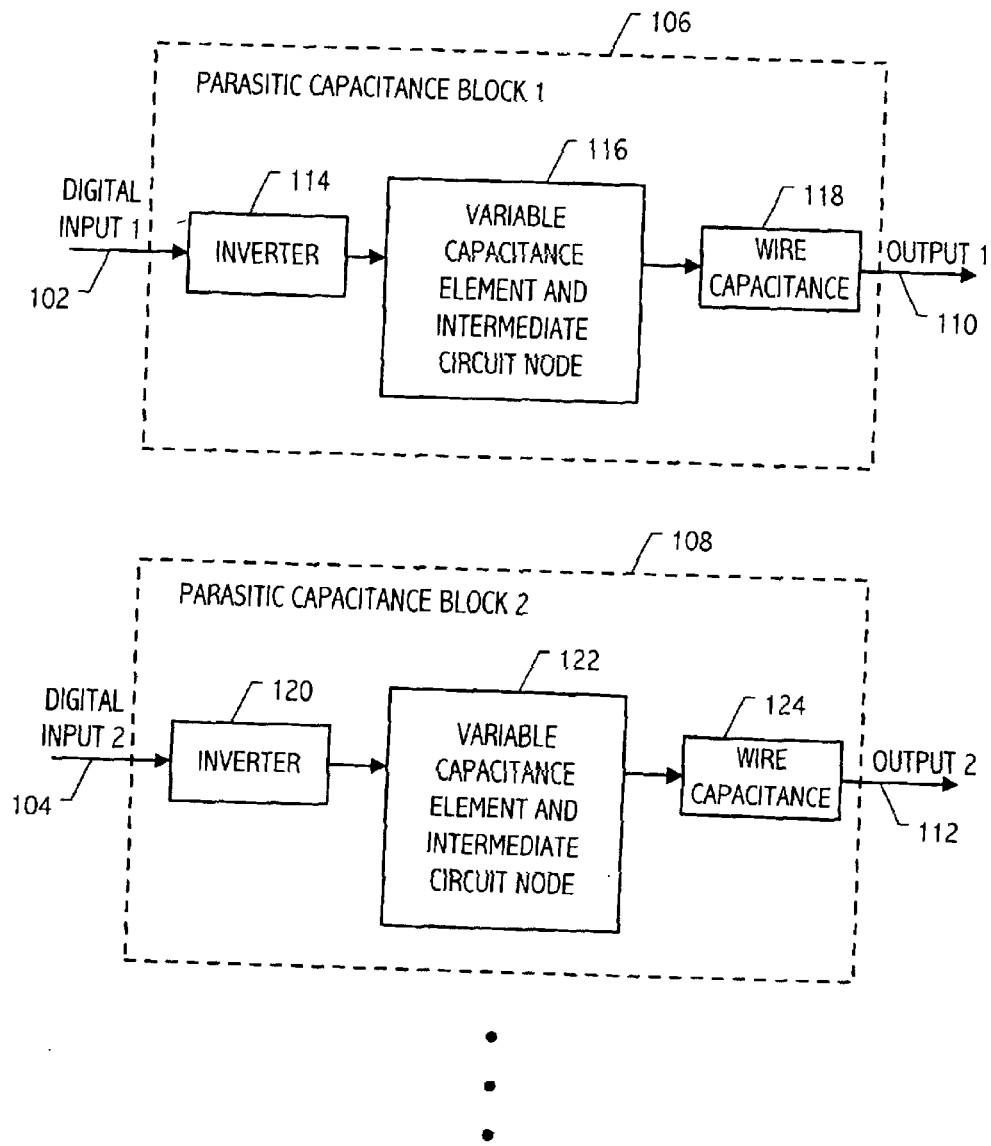
FIG. 1 is a general block diagram of a system that incorporates an embodiment in accordance with the present invention.

Referring to FIG. 1, an integrated circuit device 100 is shown. The device 100 includes a first digital input 102, a second digital input 104, a first parasitic capacitance block 106, a second parasitic capacitance block 108, a first output 110 and a second output 112. The first parasitic capacitance block 106 includes an inverter 114, a variable capacitance element and intermediate circuit node 116, and a wire capacitance 118. Similarly, the second parasitic capacitance block 108 includes inverter 120, variable capacitance element and intermediate circuit node 122, and wire capacitance 124. While the device 100 in FIG. 1 only shows first and second parasitic capacitance blocks 106 and 108, it is intended that a plurality of parasitic capacitance blocks may be used.

During operation, a digital input logic state is selected for the digital inputs 102, 104. The digital input logic state may be either a first state, representing logic 0, or a second logic state, representing logic 1. The digital logic input 102 is fed to digital inverter 114. The output of digital inverter 114 is applied to variable capacitance element 116. Depending on the logic level for the digital input 102 and the corresponding inverter output, the variable capacitance element 116 produces one of two selectable capacitance levels to wire capacitance 118. The wire capacitor 118 provides a substantially constant capacitance level. At output 110, the addition of the substantially constant wire capacitance 118 and the variable capacitance selected by variable capacitance element 116 is combined to then provide a selectable capacitance level at output node 110.

Similarly, digital input 104 provides a logic level to inverter 120 feeding variable capacitance element 122. The output of variable capacitance element 122 is combined with wire capacitance 124 in series to form a combined and selectable capacitance presented at output node 112. By connecting a number of the parasitic capacitance blocks in parallel to an output node and by using a binary weighting scheme, a selection of different high frequency capacitances can be digitally selected and connected to the output node.

Figure 2:
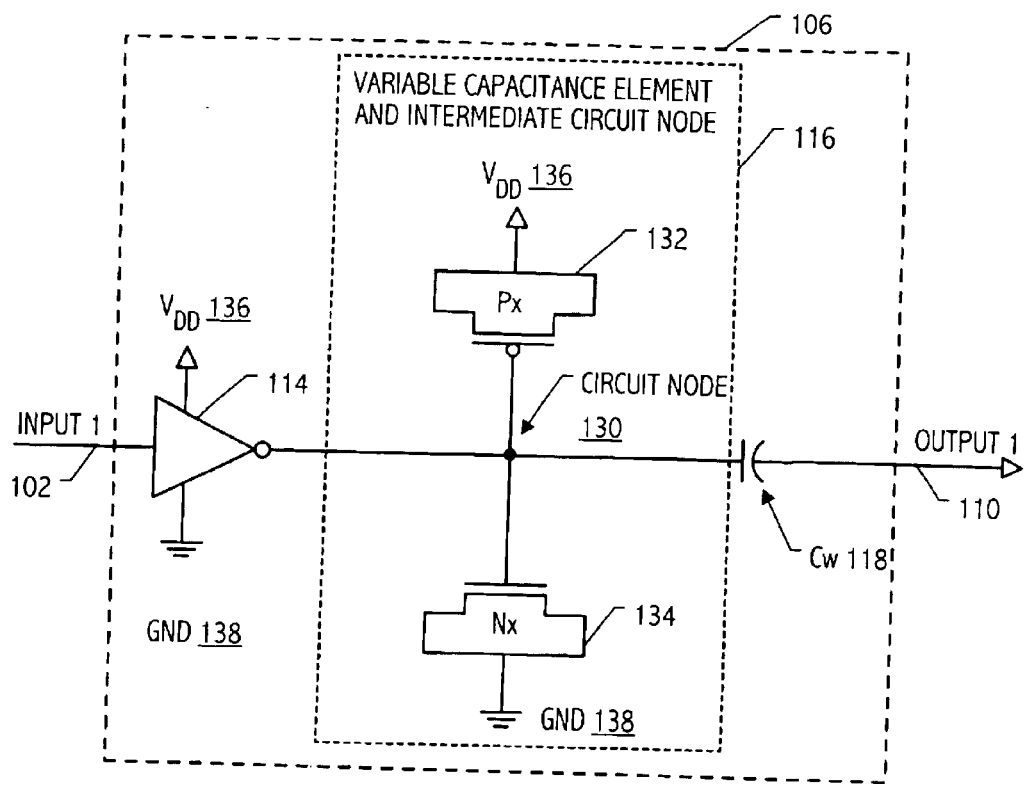
FIG. 2 is a circuit diagram that illustrates an embodiment of the parasitic capacitance block of FIG. 1.

Referring to FIG. 2, in this particular embodiment, a circuit implementation for the parasitic capacitance block 106 is shown. The parasitic capacitance block 106 includes inverter 114, wire capacitance 118, and transistor logic implementing the variable capacitance element 116. The inverter 114 has an input to receive digital input 102, a terminal coupled to ground 138, and another terminal coupled to voltage supply $V_{DD}$ 136. The inverter 114 has an output that is coupled to an intermediate node 130. The intermediate node 130 is coupled to a first transistor 132 and to a second transistor 134. The first transistor 132, labeled $P_x$ is a PMOS type transistor having its gate terminal coupled to intermediate node 130 and its drain and source terminals coupled to supply voltage $V_{DD}$ 136. The second transistor 134 is an NMOS type of transistor having its gate terminal coupled to intermediate node 130 and having its drain and source terminals coupled to ground 138.

Referring to FIG. 2 and Table 1 below, when the digital input 102 is set to the 0 logic state, the voltage at node 130 rises to supply voltage $V_{DD}$. Also, in this condition, the first transistor 132 is in a deactive (or "off" state), and the second transistor 134 is in an active (or "on" state). The resulting output 110 is terminated to ground 138.

TABLE 1

| INPUT | VOLTAGE AT NODE 130 | PX | NX | OUTPUT |
|---|---|---|---|---|
| 0 | $V_{DD}$ | OFF | ON | TERMINATES TO GROUND |
| 1 | GND | ON | OFF | TERMINATES TO $V_{DD}$ |

When the digital input 102 is set to the logic 1 level, the voltage at node 130 is at ground (also referred to as "GND"), the first transistor 132 is in the active (or "on" state), and the second transistor 134 is deactive (or in the "off" state). In this configuration, the output 110 is terminated to supply voltage $V_{DD}$ 136. As shown for the circuit of FIG. 2, the digital input 102 may be used to select a logic 0 level where the output 110 terminates to ground, or may be used to select a logic 1 level where the output 110 is terminated to the supply voltage. Thus, the digital input 102 may be used to direct termination of the output 110.

As illustrated in FIG. 2, the parasitic capacitance block is composed of two series elements and a weak inverter driving the node between the two series elements. One series element is a wire capacitance connected to the output node and to the intermediate node in the block. A digital selection signal is fed to a weak inverter (minimum width transistors with extra long lengths, e.g., 0.8/2.0 um in a 0.4 um minimum feature length technology). The inverter's output is connected to the intermediate node 130. The inverter biases node 130 to $V_{DD}$ or GND depending on the digital selection signal, but does so with a very high resistance (because its width is small and length is long). In the case of high frequency noise on node 130, the inverter 114 takes a long time (where long time is just set to be long enough such that the noise pulse or frequency is much shorter than this time) to react to the high frequency noise on node 130.

In one permutation as shown in FIG. 2, the other series element in the block is composed of a PMOS and NMOS transistor. The NMOS transistor 134 has its gate connected to node 130, and its source, drain, and bulk connected to GND. The PMOS transistor 132 has its gate connected to node 130 and its source, drain, and bulk connected to GND. For both transistors the voltage on node 130 determines whether the transistor has a channel formed under its gate or not. If the voltage on node 130 is driven by the inverter to GND, then the NMOS transistor has no channel, and the PMOS transistor does have a channel. If the voltage on node 130 is driven by the inverter to $V_{DD}$, then the NMOS transistor has a channel formed, while the PMOS transistor does not. The channel strongly affects the capacitance of the gate to the source drain connections of the transistor.

Simulation shows that in a typical 0.4 um CMOS technology the gate to source+drain capacitance (Cgs+Cgd) varies by a ratio of 3:1 depending if the channel is formed or not. For instance, the capacitance might be 300 fF (femto Farads) of Cgs+Cgd capacitance if the channel is formed and 100 fF of Cgs+Cgd capacitance if the channel is not formed. Then if node 130 is driven by the inverter to GND, the PMOS device would have three times larger capacitance than the NMOS device. The capacitor divider formed by the NMOS and PMOS device then can have a 300 fF to 100 fF ratio between $V_{DD}$ and GND if node 130 is set to GND, or a 100 fF to 300 fF ratio if node 130 is set to $V_{DD}$. The wire capacitance 118 connecting node 130 to the output node 110 can be set to a smaller value than that of the PMOS and NMOS capacitances, for instance 50 fF. Then the block present to the output node is a 44.4 fF capacitor which tracks ¾ of the high frequency noise on $V_{DD}$ (and ¼ of the noise on GND), or ¾ of the high frequency noise on GND (and ¼ of the noise on $V_{DD}$). (The output capacitance is 44.4 fF since the 50 fF wire capacitance is in series with 100 fF+300 fF.)

Figure 3:
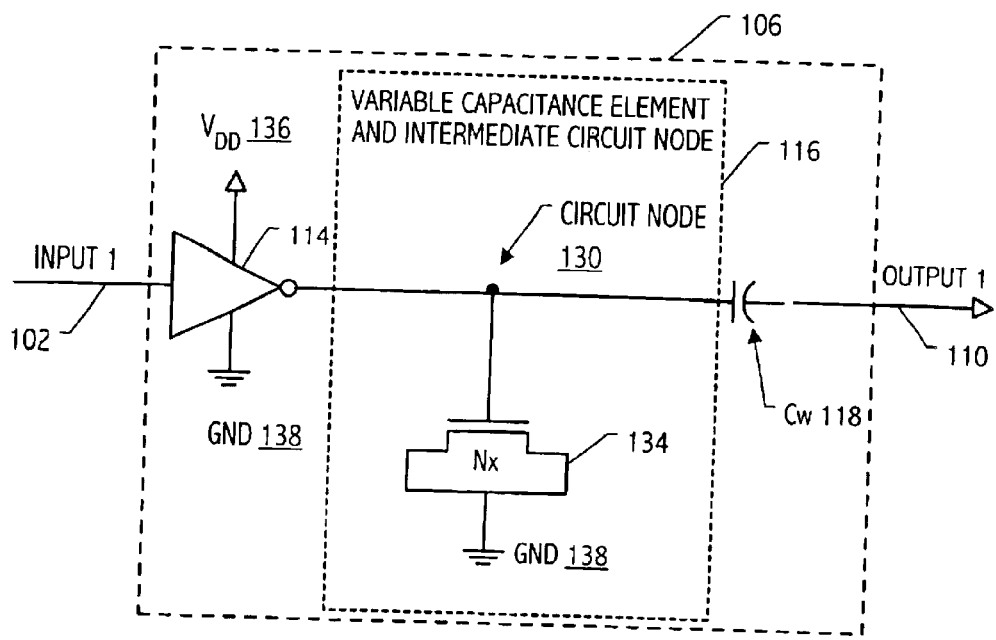
FIG. 3 is circuit diagram that illustrates another embodiment of the parasitic capacitance block of FIG. 1

Referring to FIG. 3, another implementation of the parasitic capacitance block 106 is illustrated. In this implementation, the parasitic capacitance block 106 includes inverter 114, wire capacitance 118, and a single transistor for the variable capacitance element 116. The inverter 114 is coupled to the intermediate node 130. The transistor 134, which is an NMOS type of transistor, has a gate terminal coupled to intermediate node 130. The drain and source terminals for transistor 134 are coupled to ground 138.

Referring to Table 2 below, during operation, when a first state (i.e., the logic 0 state) is present at digital input 102, the voltage at node 130 is the supply voltage $V_{DD}$. In addition, in this state of operation, the transistor 134 is active (in the "on" state) and the output 110 is terminated to ground 138. When the digital input is set to a second state (i.e., the logic 1 state), the voltage at node 130 is set to ground, the transistor 134 is in the deactive (or "off" state), and the output 110 is in a floating state. In the floating state, even though transistor 134 is deactive, certain parasitic capacitance will be present on node 130. Depending on whether transistor 134 is active or deactive, intermediate node 130 will have one of two different capacitances. Where the transistor 134 is active and a channel is formed, the gate capacitance between intermediate node 130 and ground is at a higher level. But, where transistor 134 is deactive, the gate channel is not formed within transistor 134, and the intermediate node 130 is presented with a lower capacitance with respect to ground 138. The variable capacitance nature of transistor configuration 134 then presents, in combination with substantially constant capacitor 118, a variable combined capacitance to the output 110.

TABLE 2

| INPUT | VOLTAGE AT NODE 130 | NX | OUTPUT |
|---|---|---|---|
| 0 | $V_{DD}$ | ON | TERMINATES TO GROUND |
| 1 | GND | OFF | FLOATING |

Figure 4:
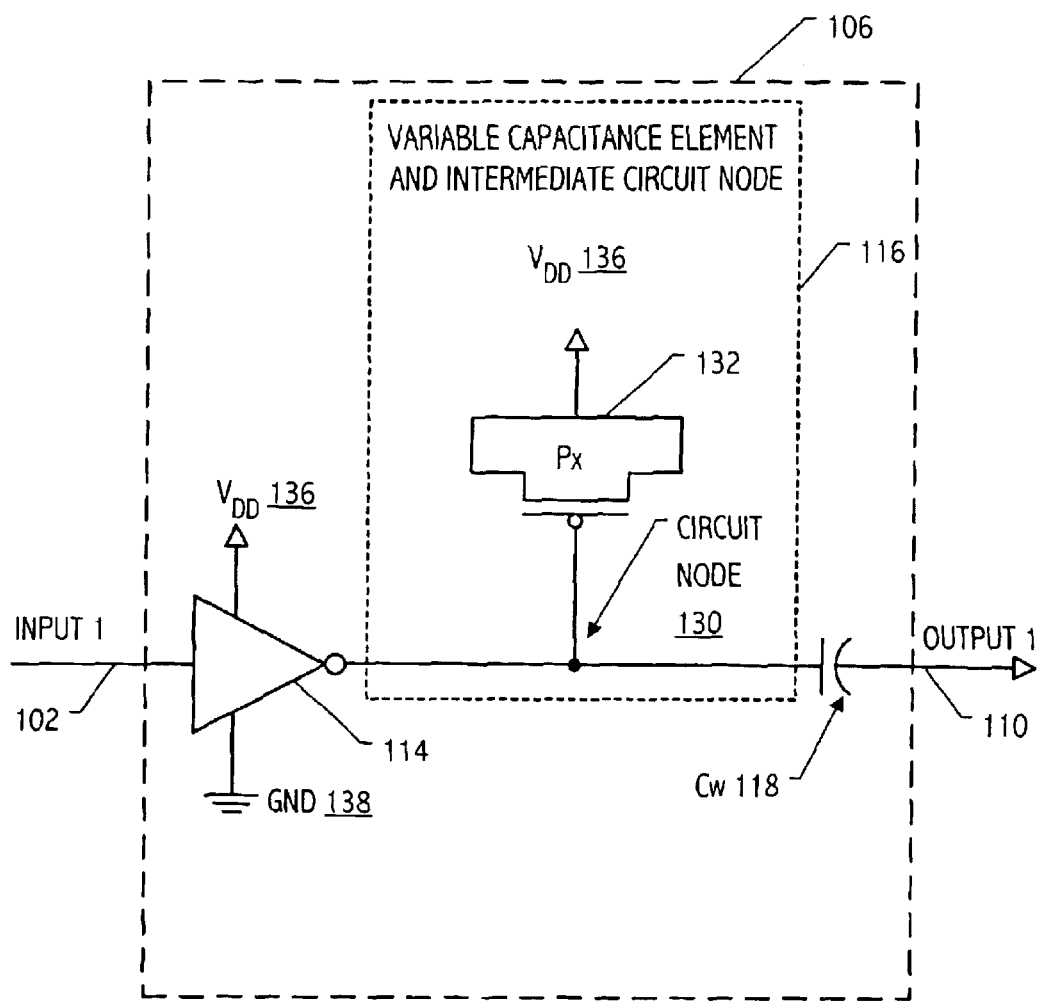
FIG. 4 is a is circuit diagram that illustrates another embodiment of the parasitic capacitance block of FIG. 1

Referring to FIG. 4, another circuit implementation of the parasitic capacitance block 106 is shown. In this particular embodiment, the parasitic capacitance block 106 includes inverter 114, wire capacitance 118, and a single PMOS transistor 132. In this embodiment, the PMOS transistor 132 has its gate terminal coupled to intermediate node 130, and has its drain and source terminals coupled to voltage supply source $V_{DD}$ 136.

Referring to Table 3 below, during operation of the circuit shown in FIG. 4, when a logic 0 state is present on digital input 102, the voltage at node 130 is the supply voltage $V_{DD}$, the transistor 132 is in an "off" state, and the output 110 is floating. When the digital input 102 is set to the logic 1 state, the voltage at node 130 is at ground, the transistor 132 is in an active (or "on" state), and the output 110 terminates to the supply voltage $V_{DD}$ 136. In addition to allowing selection of the output termination to either voltage supply $V_{DD}$ or to a floating condition, the output 110 is presented with two distinct levels of capacitance based on the binary logic states of digital input 102. The variable capacitance is produced by the transistor 132 where in one state a channel is formed and an increased capacitance is present, and in another logic state, no channel is formed and a lower capacitance is present.

TABLE 3

| INPUT | VOLTAGE AT NODE 130 | PX | OUTPUT |
|---|---|---|---|
| 0 | $V_{DD}$ | OFF | FLOATING |
| 1 | GND | ON | TERMINATES TO $V_{DD}$ |

In the embodiments of FIGS. 3 and 4 where only a single NMOS or PMOS transistor is in the parasitic capacitor block, the wire capacitance may be sized to be large (at least a comparable size to the capacitance of the NMOS or PMOS transistor). For instance, if the NMOS transistor has 100 fF and 300 fF off and on capacitances, respectively, then the wire capacitance could be set to 300 fF. Then if node 130 is driven to GND, the output node is loaded by an effective 75 fF of capacitance to GND. If node 130 is driven to $V_{DD}$, then the output node is loaded by an effective 150 fF of capacitance to GND. This gives 2:1 ratio for the capacitance. To achieve nearer to a 3:1 ratio, the capacitance of the wire capacitance needs to be larger than 300 fF.

One note is that the bulk node under the gate of the transistor presents a large capacitance which connects to the gate of the transistor when there is no channel formed. At low frequencies this capacitance would prevent any appreciably different total capacitance on the gate of the transistor whether there was a channel or not. However, the bulk of the transistor is composed of a weakly resistive p- (in NMOS) or n- (in PMOS) semiconductor. The resistance of the bulk node is high enough so that the bulk capacitance is effectively removed at high frequencies (because its RC delay time is long). To enhance the resistance of the bulk node, any substrate may be placed as far away as possible (given latch-up design rules) from the NMOS and PMOS transistors.

Figure 5:
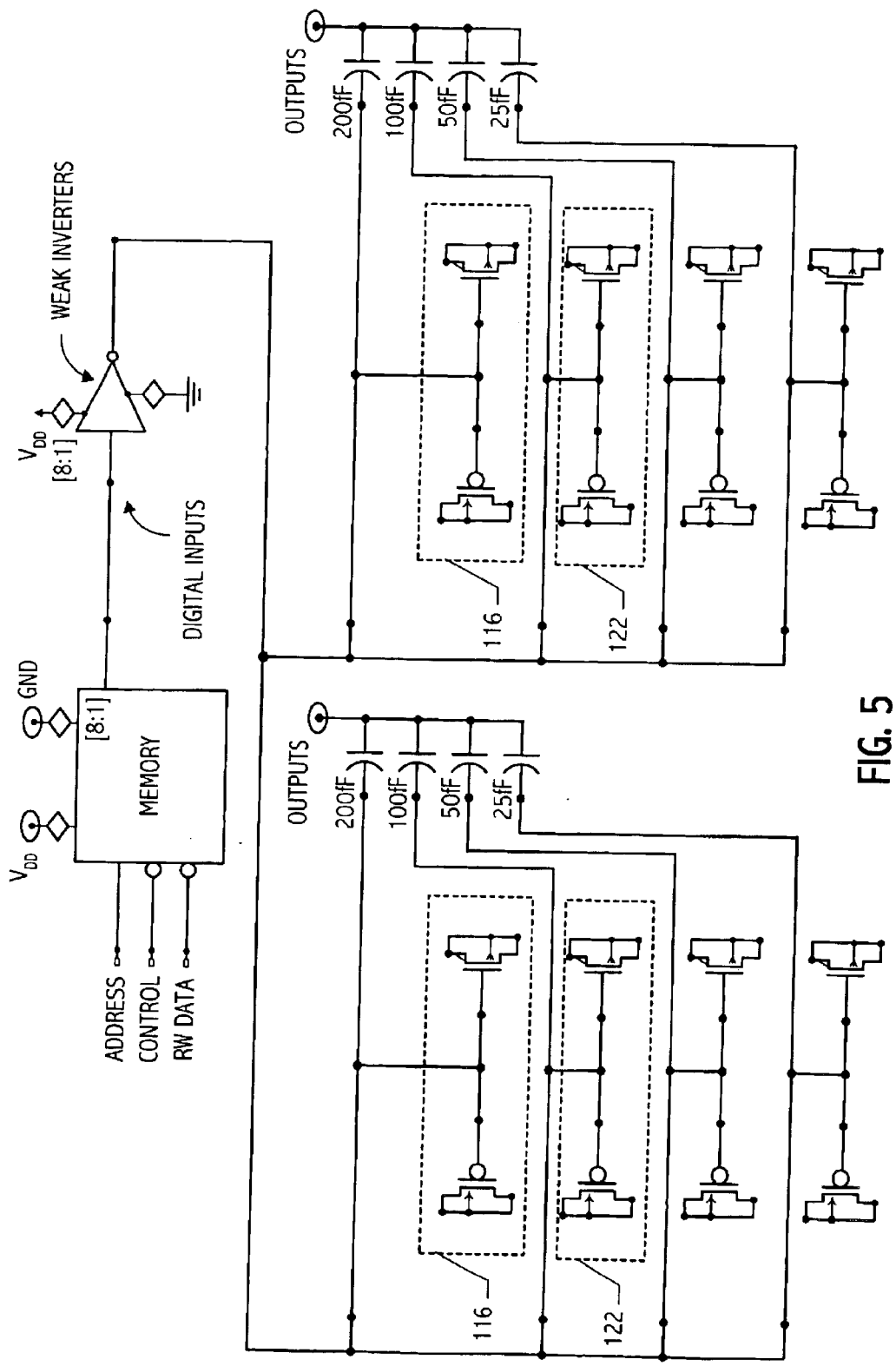
FIG. 5 is a circuit diagram that illustrates a particular implementation of the system of FIG. 1.

Referring to FIG. 5, a further detailed circuit that includes a plurality of different parasitic capacitance blocks is shown. The integrated circuit includes a plurality of digital inputs labeled 1-8, a plurality of inverters, a plurality of different parasitic capacitance blocks (each providing different levels of selective capacitance), a plurality of wire capacitances, and a plurality of different outputs. In the particular implementation shown in FIG. 5, each of the parasitic capacitance blocks uses the two-transistor configuration illustrated in FIG. 2. During operation, by selecting logic levels for the various digital inputs, different capacitance and output termination levels may be selected for each of the plurality of outputs. In this manner, particular outputs may be terminated to either ground or to the supply voltage and particular selectable capacitances may be applied. For example, several different capacitances may be added to form a matching capacitance to compensate for noise on either the ground or the supply voltage input to the integrated circuit.

Figure 6:
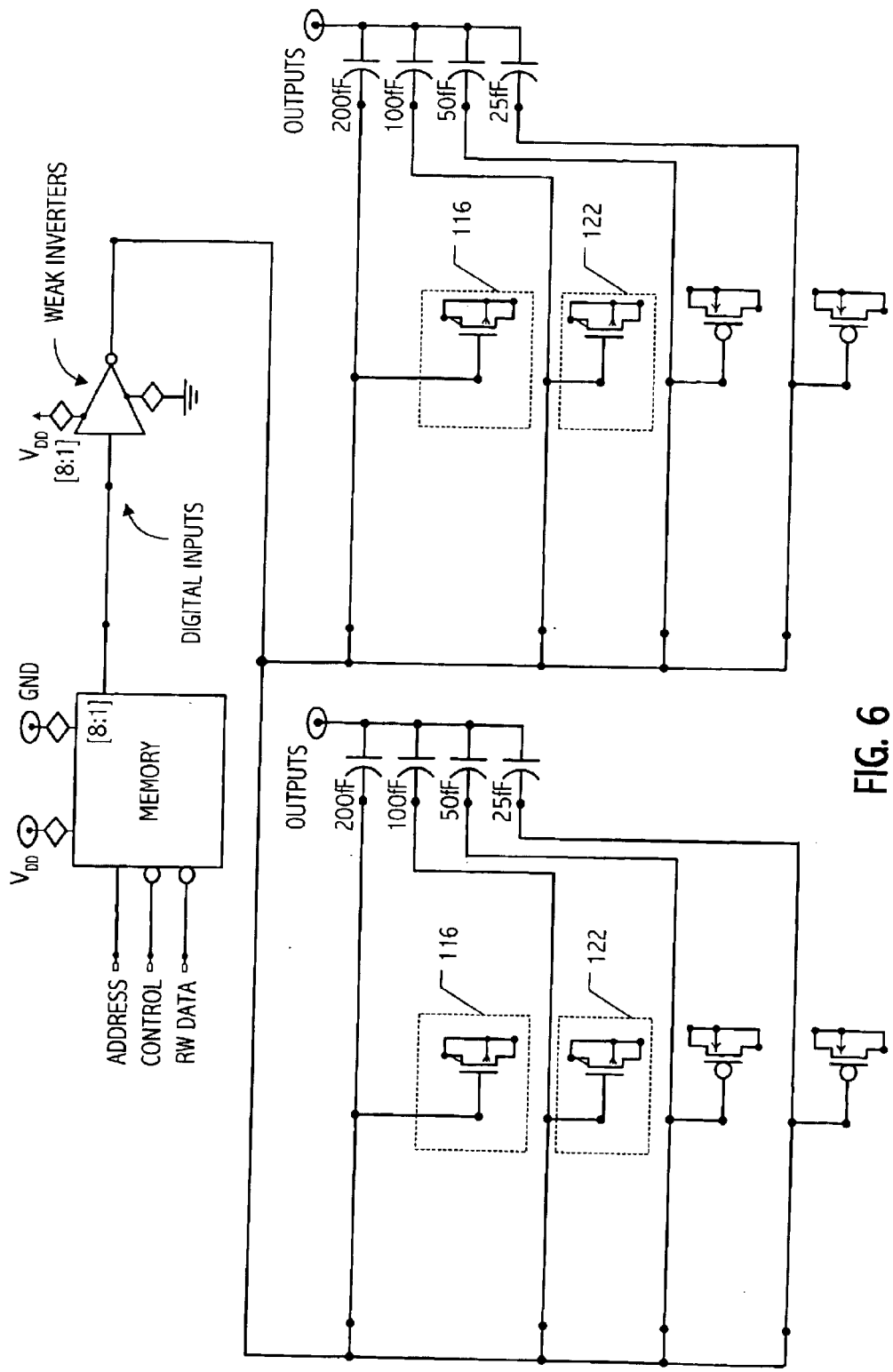
FIG. 6 is a circuit diagram that illustrates another particular implementation of the system of FIG. 1.

FIG. 6 shows another particular implementation of an integrated circuit device including a plurality of different parasitic capacitance blocks. In this particular implementation, a combination of single transistor variable capacitance elements is used. Both the P-channel type transistor configuration and the N-channel type transistor configurations are shown.

Figure 7:
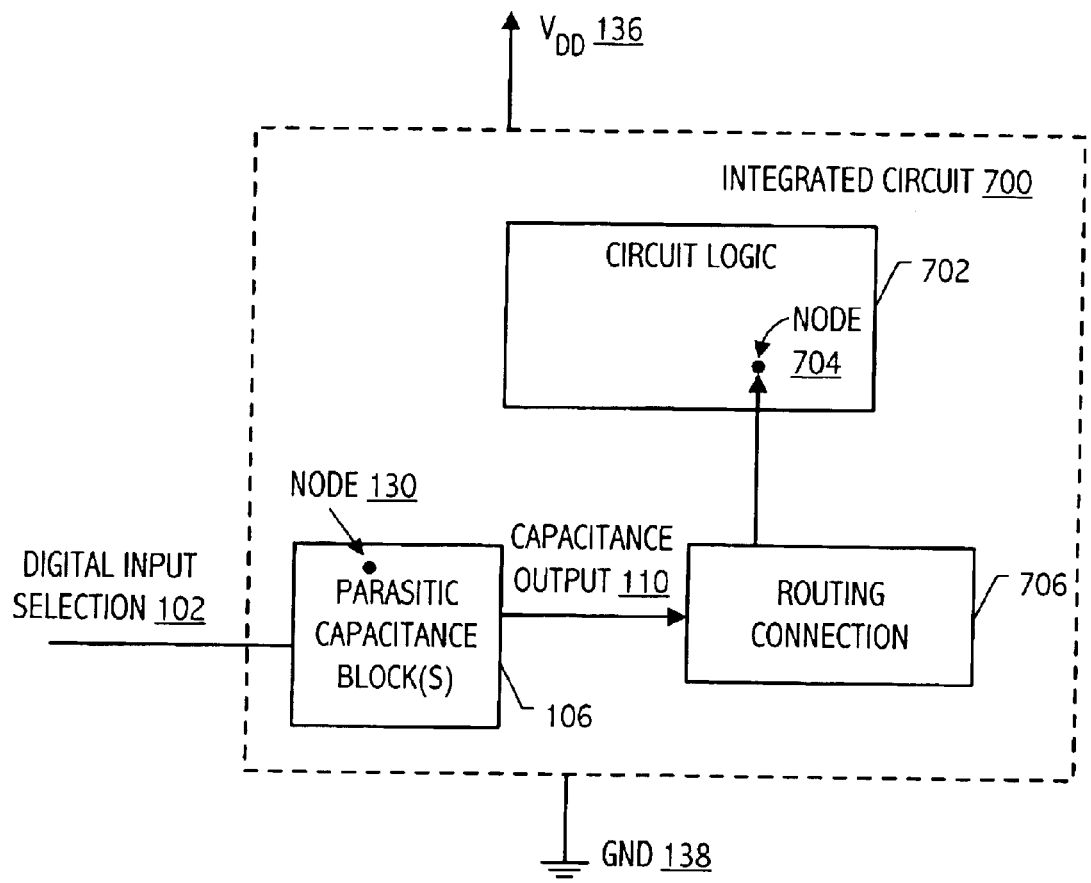
FIG. 7 is a general block diagram that illustrates an embodiment of an integrated circuit incorporating a parasitic capacitance block.

Referring to FIG. 7, an integrated circuit 700 that uses the parasitic capacitance blocks described previously is shown. The integrated circuit 700 includes parasitic capacitance blocks 106, circuit logic module 702 and routing connection 706. The integrated circuit has a ground 138 and a supply voltage 136. Integrated circuit 700 includes digital input selection such as digital input 102. The parasitic capacitance block includes intermediate node 130, and the circuit logic module 702 includes at least one node such as node 704. Routing connection 706 may be used to apply an output 110 from the parasitic capacitance block 106 to adjust an effective capacitance for nodes within the circuit logic 702. For example, by selecting a particular logic level or set of logic levels at digital input 102, the output 110 may be adjusted to have a programmed and predetermined capacitance level. The selected capacitance level may then be applied to an internal node within the circuit logic, such as node 704, so that the particular circuit node within the circuit logic has a desired capacitance with respect to either ground 138 or supply voltage 136. In this manner, the effective capacitance to supply voltage 136 or ground 138 may be selectively modified and matched so that noise present on voltage supply 136 or ground 138 may be managed effectively.

As illustrated, a use of a digitally selectable and modifiable capacitance is to match the response of two nodes to high frequency noise on the high and low power supplies of an integrated circuit (IC). For instance, if the $V_{DD}$ supply of the IC undergoes a 0.5 volt voltage step, then depending on the parasitic capacitance from a node to $V_{DD}$ and to GND, the node will step somewhere from 0.5 to 0.0 volts. For instance, if the node has 100 fF of parasitic capacitance to $V_{DD}$ and no capacitance to GND, then the node will undergo a 0.5-volt noise step. But, if the node also has 100 fF of parasitic capacitance to GND, then the node will only undergo a 0.25 noise step.

As an example, if there are two nodes on the IC, nodeA and nodeB, and nodeA has 100 fF and 200 fF of parasitic capacitance to $V_{DD}$ and GND, respectively, while nodeB has 200 fF and 200 FF of parasitic capacitance to $V_{DD}$ and GND, respectively, then for a 1-volt noise step on $V_{DD}$, nodeA will bounce 333 mV, while nodeB will bounce 500 mV. If the two nodes are differentially compared (for instance if one node is a data signal and the other node is a reference voltage), then the 500 mV–333 mV=167 mV difference shows up as noise. Using a capacitance circuit such as shown in FIGS. 1–6, additional capacitance could be added to nodeA to match the ratio of parasitic capacitances seen on nodeB so that it also has a 500 mV noise bounce and there would be substantially no voltage difference between the two nodes. The power supply noise bounce can be at a very high frequency (<200 picosecond (ps) transition time); thus, the added parasitic capacitance needs to have very low series resistance so that its RC time constant is less than the noise's highest frequency. In such an application it would not be desirable to use the conventional pass gate circuit (e.g., as described in Dally and Poulton, Digital Systems Engineering," 1998), where a pass gate transistor is used to select and add external capacitance since the resistance of the pass gate would be too high and would not achieve the required short RC delay time.

Thus, there has been described herein illustrative embodiments of an integrated circuit and method of adjusting capacitance of a node of an integrated circuit. It will be apparent to those skilled in the art that the disclosed subject matter may be modified in numerous ways and may assume many embodiments other than the particular illustrative form specifically set out and described above.

Accordingly, the above disclosed subject matter is to be considered illustrative and the appended claims are intended to cover all such modifications and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit comprising:
   a digital input;
   an output node; and
   a variable capacitance block coupled to the input node and the output node, the variable capacitance block further comprising:
   a biasing circuit responsive to the digital input;
   a capacitance element coupled to the output node and an intermediate node defined between the biasing circuit and the capacitance element; and
   a variable capacitance element coupled between the biasing circuit and the capacitance element,
   wherein the biasing circuit is responsive to the digital input to bias the intermediate node, thereby controlling the variable capacitance element that varies capacitance presented at the output node.

2. The integrated circuit of claim 1, wherein the capacitance element includes a substantially constant capacitance.

3. The integrated circuit of claim 1, wherein the variable capacitance element includes one or more transistors each having a respective gate terminal coupled to the intermediate node.

4. The integrated circuit of claim 3, wherein a bias voltage across at least one of the transistors controls a capacitance contributed by the transistor.

5. The integrated circuit of claim 1, wherein the variable capacitance element includes at least first and second transistors each having respective gate terminals coupled to the intermediate node, the first transistor having source and drain terminals coupled to a first power supply voltage and the second transistor having source and drain terminals coupled to a second power supply voltage.

6. The integrated circuit of claim 1, wherein the biasing circuit includes a weak inverter.

7. The integrated circuit of claim 1, wherein the biasing circuit includes a transistor having a width that is substantially smaller than its length.

8. The integrated circuit of claim 7, wherein the width of the transistor is less than two times its length.

9. The integrated circuit of claim 1, wherein the capacitance element and the variable capacitance element are series coupled.

10. The integrated circuit of claim 1, wherein the variable capacitance element includes a PMOS-type transistor with a gate terminal thereof coupled to the intermediate node and source and drain terminals thereof coupled to a voltage source.

11. The integrated circuit of claim 1, wherein the variable capacitance element includes an NMOS-type transistor with a gate terminal thereof coupled to the intermediate node and source and drain terminals thereof coupled to ground.

12. The integrated circuit of claim 1, wherein the biasing element has a first terminal connected to the digital input, a second terminal connected to a voltage source, and a third terminal connected to ground.

13. The integrated circuit of claim 1, wherein variable capacitance element is controllable to provide at least two capacitive states based on the bias at the intermediate node.

14. The integrated circuit of claim 1, wherein the output node is coupled to adjust an effective capacitance of a node of another circuit.

15. An integrated circuit comprising:
   a digital input;
   a variable capacitance block comprising:
   a biasing circuit responsive to the digital input;
   a first intermediate node;
   a capacitance element coupled to an output node and the first intermediate node defined between the biasing circuit and the capacitance element; and
   a variable capacitance element coupled between the biasing circuit and the capacitance element,
   wherein the variable capacitance block provides an output having a selectable capacitance, the output having a first capacitance when the digital input is in a first logic state and a second capacitance when the digital input is in a second logic state;
   circuit logic, the circuit logic containing a second intermediate node; and
   a routing connection responsive to the output of the variable capacitance block, the routing connection applying the output of the variable capacitance block to the second intermediate node to adjust capacitance on the second intermediate node.

16. The integrated circuit of claim 15, wherein the routing connection is used to selectively modify capacitance of the second intermediate node by applying a first capacitance level when the digital input is in a first logic state and by applying a second capacitance level when the digital input is in a second logic state.

17. The integrated circuit of claim 15, further comprising a plurality of variable capacitance blocks, each of the plurality of variable capacitance blocks having an output and each output having a different capacitance level.

18. A method of varying a characteristic of an integrated circuit, the method comprising:

selecting a logic state of a digital input;

biasing an internal node of a variable capacitance block in response to the digital input, the variable capacitance block having an output that presents a first capacitance when the digital input is in a first logic state and a second capacitance when the digital input is in a second logic state;

varying capacitance presented at a circuit node of the integrated circuit coupled to the output by changing the digital input, wherein the variable capacitance block comprises:
 a biasing circuit responsive to the digital input;
 a first intermediate node;
 a capacitance element coupled to the output and the first intermediate node defined between the biasing circuit and the capacitance element; and
 a variable capacitance element coupled between the biasing circuit and the capacitance element.

19. The method of claim 18, wherein the circuit node is carrying an electronic signal having a frequency greater than one gigahertz.

20. The method of claim 18, wherein the variable capacitance element includes at least one active element responsive to bias at the internal node and having a first variable capacitance when the digital input is in a first logic state and having a second variable capacitance when the digital input is in a second logic state.

21. The method of claim 20, wherein the active element comprises at least one transistor and wherein the variable capacitance includes gate capacitance thereof.

* * * * *